US008314866B2

(12) United States Patent
Massetti

(10) Patent No.: US 8,314,866 B2
(45) Date of Patent: Nov. 20, 2012

(54) IMAGER WITH VARIABLE AREA COLOR FILTER ARRAY AND PIXEL ELEMENTS

(75) Inventor: Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 239 days.

(21) Appl. No.: 12/755,125

(22) Filed: Apr. 6, 2010

(65) Prior Publication Data

US 2011/0242374 A1 Oct. 6, 2011

(51) Int. Cl.
*H04N 9/083* (2006.01)
*H04N 3/14* (2006.01)
*H04N 5/335* (2011.01)
*H04N 9/04* (2006.01)

(52) U.S. Cl. .................... 348/275; 348/280; 348/281

(58) Field of Classification Search .................. 348/272, 348/275, 280, 281
See application file for complete search history.

(56) References Cited

U.S. PATENT DOCUMENTS

| | | | |
|---|---|---|---|
| 3,971,065 A | 7/1976 | Bayer | |
| 5,031,032 A * | 7/1991 | Perregaux et al. | 348/275 |
| 5,119,181 A * | 6/1992 | Perregaux et al. | 348/275 |
| 6,184,929 B1 * | 2/2001 | Noda et al. | 348/315 |
| 6,642,964 B1 * | 11/2003 | Perregaux et al. | 348/315 |
| 6,646,682 B1 | 11/2003 | Hou | |
| 6,654,056 B1 * | 11/2003 | Perregaux et al. | 348/275 |
| 6,885,398 B1 * | 4/2005 | Sladen | 348/273 |
| 7,705,901 B2 * | 4/2010 | Kobayashi | 348/315 |
| 7,742,088 B2 * | 6/2010 | Shizukuishi | 348/272 |
| 7,982,786 B2 * | 7/2011 | Nishida et al. | 348/272 |
| 2007/0171290 A1 * | 7/2007 | Kroger | 348/272 |
| 2009/0096900 A1 * | 4/2009 | Pang et al. | 348/294 |
| 2010/0013853 A1 | 1/2010 | Takatori | |
| 2010/0157116 A1 * | 6/2010 | Kikuchi | 348/272 |
| 2011/0019004 A1 * | 1/2011 | Ohmori et al. | 348/164 |

OTHER PUBLICATIONS

Definition of "triangular" from Dictionary.com; http://dictionary.reference.com/browse/triangular?s=t, accessed May 24, 2012.*
"Sony has twins, with more on the way!", contributed by Ray Fontaine, Process Analyst, posted Jun. 24, 2008, 2 pages.

* cited by examiner

*Primary Examiner* — Daniel M Pasiewicz
(74) *Attorney, Agent, or Firm* — Blakely Sokoloff Taylor & Zafman LLP

(57) ABSTRACT

A color pixel array includes a plurality of micropixels. Each micropixel includes a photosensitive element and a color filter optically aligned with the photosensitive element to filter incident light prior to reaching the photosensitive element. The micropixels are organized into a repeating pattern of triangular macropixels each having a triangular shape within the color pixel array.

25 Claims, 9 Drawing Sheets

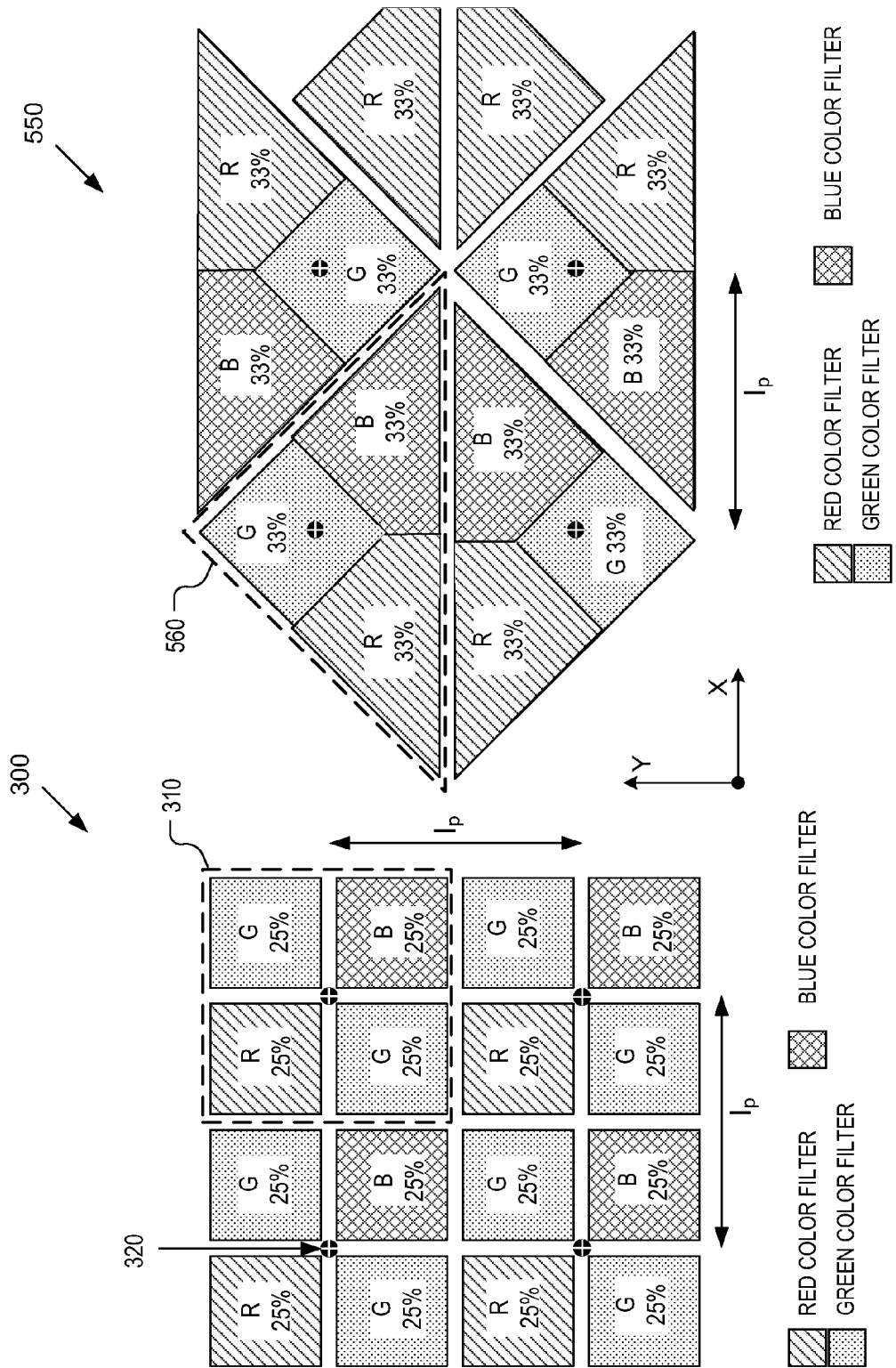

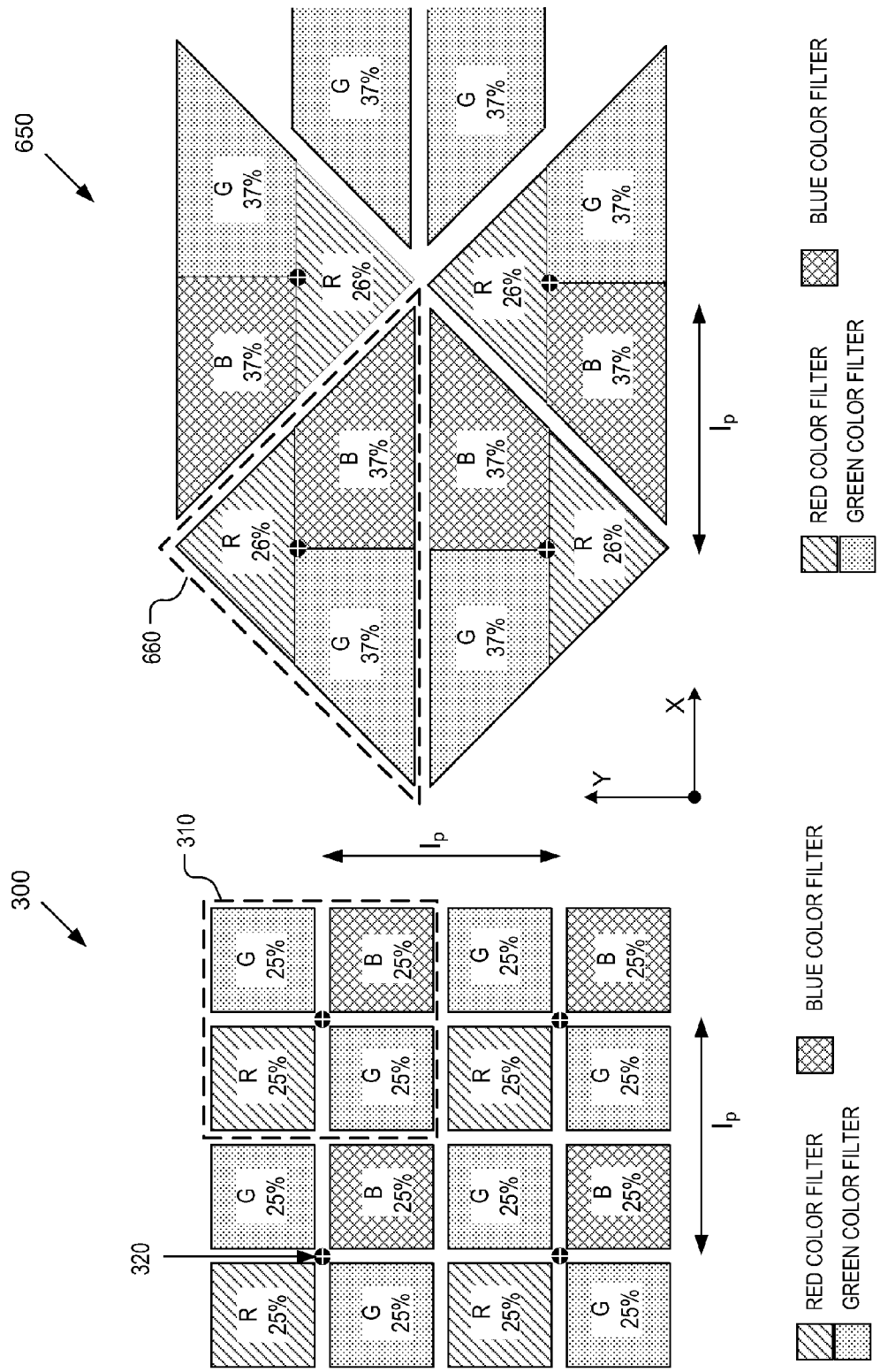

IMAGER WITH VARIABLE AREA COLOR FILTER ARRAY AND PIXEL ELEMENTS

TECHNICAL FIELD

This disclosure relates generally to image sensors, and in particular but not exclusively, relates to CMOS image sensors with non-rectangular photosensitive elements.

BACKGROUND INFORMATION

Image sensors have become ubiquitous. They are widely used in digital still cameras, cellular phones, security cameras, as well as, medical, automobile, and other applications. The technology used to manufacture image sensors, and in particular, complementary metal-oxide-semiconductor ("CMOS") image sensors ("CIS"), has continued to advance at great pace. For example, the demands of higher resolution and lower power consumption have encouraged the further miniaturization and integration of these image sensors.

One field of application in which size and image quality is particularly important is medical applications (e.g., endoscopes). For medical applications the chip must typically be small while providing a high quality image. In order to achieve these characteristics, for a given chip size, the photosensitive apertures should be as large as possible, while peripheral circuitry should be as limited as possible.

The pixel (picture element) fill factor denotes the fraction of the surface area of a pixel that is sensitive to light. Pixel pitch is the physical distance between adjacent pixels in an imaging device. Pixel fill factor has become smaller as pixel pitch has been reduced because the active circuit elements and metal interconnect consume an increasing proportion of the area in each pixel as the photosensitive regions are reduced in size. One way to address the loss of fill factor is to use a microscale lens (microlens) directly above each pixel to focus the light directly towards the photosensitive portion of the area within the pixel. Another way to address the loss of fill factor is to use backside illuminated ("BSI") image sensors, which place the active pixel circuit elements and metal interconnects on a frontside of an image sensor die and the photosensitive element within the substrate facing a backside of an image sensor die. For BSI image sensors, the majority of photon absorption occurs near the backside silicon surface. However, a solution that provides larger individual pixel area on the same silicon area would improve BSI image sensors as well as frontside illuminated image sensors.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 5A is a schematic representation of Bayer patterned macropixel blocks.

FIG. 5B is a schematic representation of triangular macropixel blocks each including three micropixels arranged on an X, Y grid, in accordance with a third embodiment of the invention.

FIG. 6A is a schematic representation of Bayer patterned macropixel blocks.

FIG. 6B is a schematic representation of triangular macropixel blocks each including three micropixels arranged on an X, Y, grid, in accordance with a fourth embodiment of the invention.

DETAILED DESCRIPTION

Embodiments of an apparatus for a backside illuminated ("BSI") image sensor with a color filter array of non-rectangular elements are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
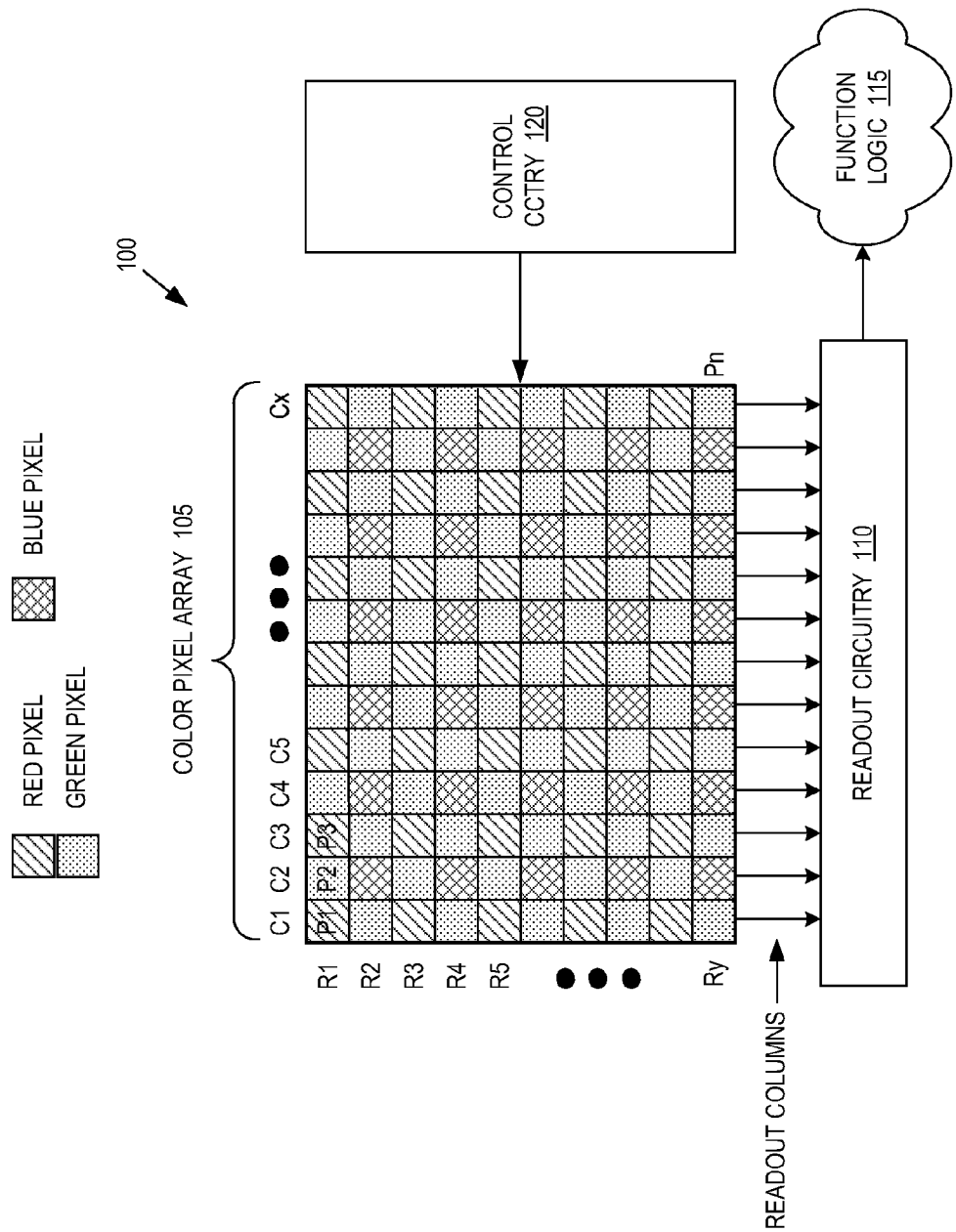
FIG. 1 is a block diagram illustrating a backside illuminated imaging system.

FIG. 1 illustrates an embodiment of a BSI image sensor 100 including a color pixel array 105, readout circuitry 110, function logic 115, and control circuitry 120. Color pixel array 105 is a two-dimensional ("2D") array of imaging pixels (e.g., pixels P1, P2 . . . , Pn) having X number of pixel columns (horizontal axis) and Y number of pixel rows (vertical axis). In one embodiment, each pixel is a complementary metal-oxide-semiconductor ("CMOS") imaging pixel. Color pixel array 105 may be implemented as either a front side illuminated pixel array or a backside illuminated pixel array. As illustrated, each pixel is arranged into a row (e.g., rows R1 to Ry) and a column (e.g., column C1 to Cx) to acquire image data of a person, place, or object, which can then be used to render a 2D image of the person, place, or object. In one embodiment, color pixel array 105, readout circuitry 105, and control circuitry 120 are all integrated onto a single semiconductor die.

After each pixel has acquired its image data or image charge, the image data is readout by readout circuitry 110 and transferred to function logic 115. Readout circuitry 110 may include amplification circuitry, analog-to-digital ("ADC") conversion circuitry, or otherwise. Function logic 115 may simply store the image data or even manipulate the image data by applying post image effects (e.g., crop, rotate, remove red eye, adjust brightness, adjust contrast, or otherwise). Control circuitry 120 is coupled to pixel array 105 to control operational characteristic of color pixel array 105. For example, control circuitry 120 may generate a shutter signal for controlling an image acquisition window.

Color pixel array 105 may also be referred to as a color filter array ("CFA"). The CFA may capture color image data using a number of techniques including additive filters and subtractive filters. Conventional color pixel array patterns are almost exclusively comprised of identical pixel elements, referred to as micropixels, each having a square shape and arranged in square X, Y patterns. Hexagonal and octagonal pixels have been proposed, but repeating pixel units, referred to as macropixels, are usually found in groups of four. The macropixels are formed of groups of micropixels having a repeating pattern within the array. In the vast majority of digital camera image sensors, the most popular CFA is the Bayer pattern. Using a checkerboard pattern with alternating rows of filters, the Bayer pattern has twice as many green pixels as red or blue pixels. They are arranged in alternating rows, of red pixels wedged between green pixels and of blue pixels wedged between green pixels. This takes advantage of the human eye's predilection to see green luminance as the strongest influence in defining sharpness. The Bayer pattern produces identical images regardless of how you hold the camera—landscape or portrait orientations.

A macropixel that includes four micropixels arranged in an X, Y array is not flexible to arbitrarily adjust the proportion of colors within the macropixel. Each micropixel represents 25% of the total area, so colors are assigned in 25% increments. It may be useful to have more flexibility in the assignment of color proportions in order to optimize an image sensor for various applications, for example, the optimal human visual sensitivity may differ from a machine's optimal visual sensitivity.

Figure 2:
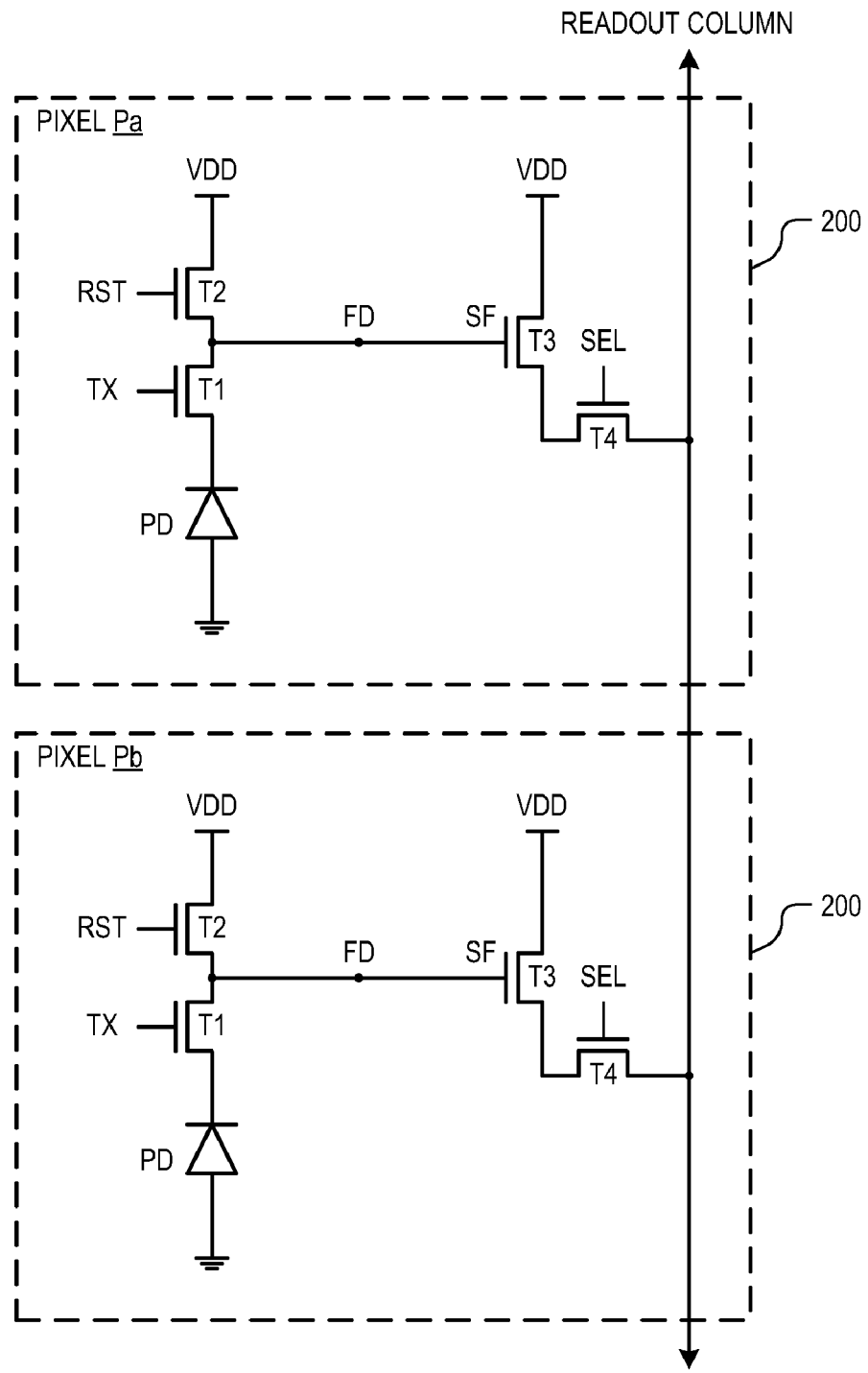
FIG. 2 is a circuit diagram illustrating pixel circuitry of two 4T pixels within a backside illuminated imaging system, in accordance with an embodiment of the invention.

FIG. 2 is a circuit diagram illustrating pixel circuitry blocks 200 of two four-transistor ("4T") pixels within a BSI imaging array, in accordance with an embodiment of the invention. Pixel circuitry blocks 200 represent one possible pixel circuitry architecture for implementing each pixel within color pixel array 105 of FIG. 1. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 2, pixels Pa and Pb are arranged in two rows and one column. The illustrated embodiment of each pixel circuitry block 200 includes a photosensitive element PD, a transfer transistor T1, a reset transistor T2, a source-follower ("SF") transistor T3, and a select transistor T4. During operation, transfer transistor T1 receives a transfer signal TX, which transfers the charge accumulated in photosensitive element PD to a floating diffusion node FD. In one embodiment, floating diffusion node FD may be coupled to a storage capacitor for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry 200 to the readout column line under control of a select signal SEL. In one embodiment, the TX signal, the RST signal, and the SEL signal are generated by control circuitry 120.

Figures 3A, 3B:
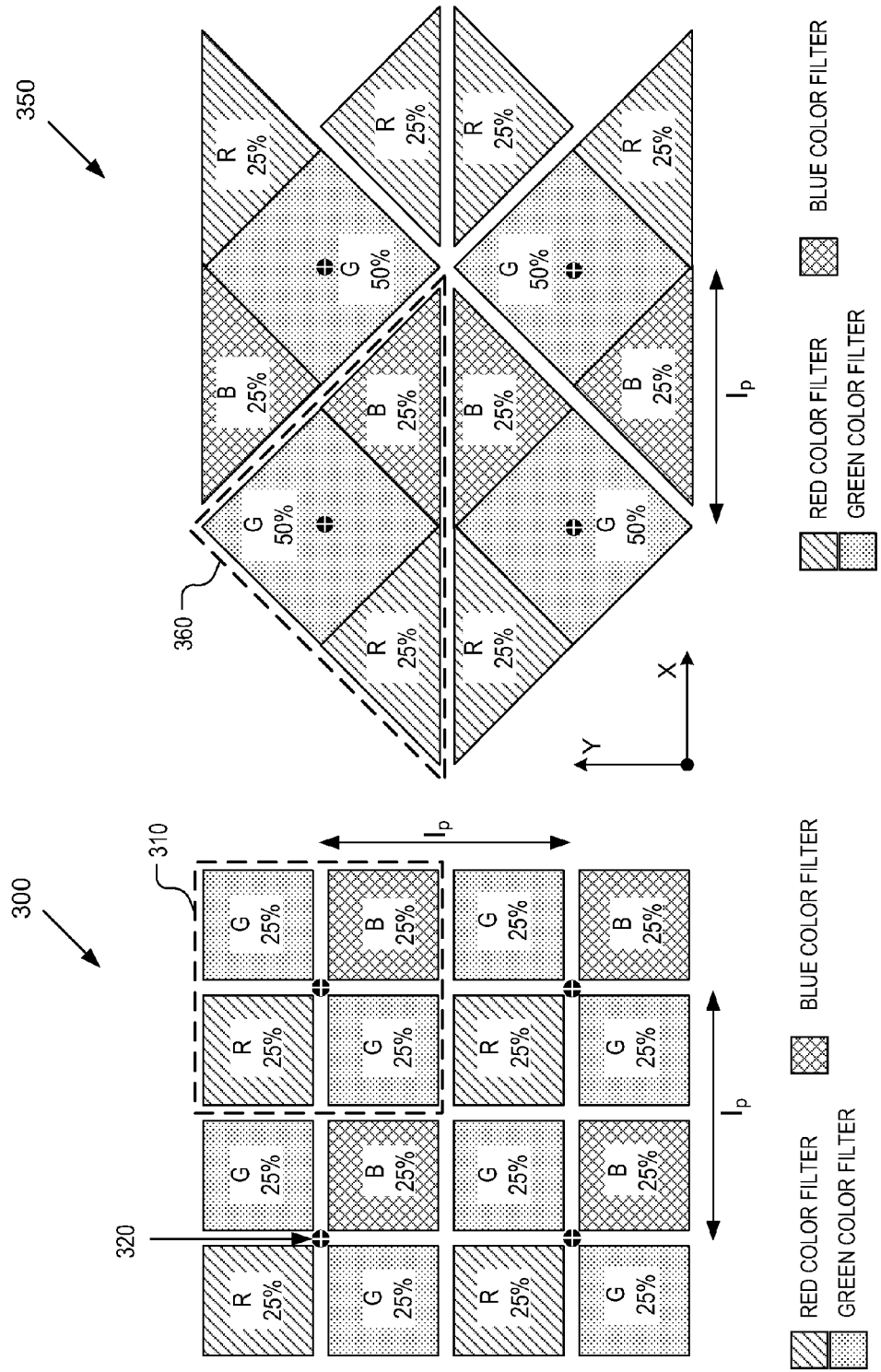
FIG. 3A is a schematic representation of Bayer patterned macropixel blocks.
FIG. 3B is a schematic representation of triangular macropixel blocks each including three micropixels arranged on an X, Y grid, in accordance with a first embodiment of the invention

FIG. 3A illustrates a color pixel array 300 including micropixels organized into a Bayer pattern macropixel 310. The Bayer pattern macropixels are located on a uniform X, Y grid within pixel array 105 and have a constant separation distance Ip or pitch. Separation distance Ip is determined by measuring the distance between two grid points, such as grid points 320, each falling at a common reference point within adjacent macropixels.

It should be noted that in backside illuminated ("BSI") image sensors, the illumination of photosensitive element PD occurs without interference from any metal or dielectric layers that form, for example, the transistor components of the pixel circuitry and associated interconnects, allowing incident light a more direct path through to the photosensitive element. In a front side illuminated ("FSI") image sensor, the photosensitive element is formed on the side of the semiconductor substrate closest to the polysilicon, dielectric, and metal layers such that care must be taken to ensure that the metal layers do not interfere with the light collection path.

Figure 7:
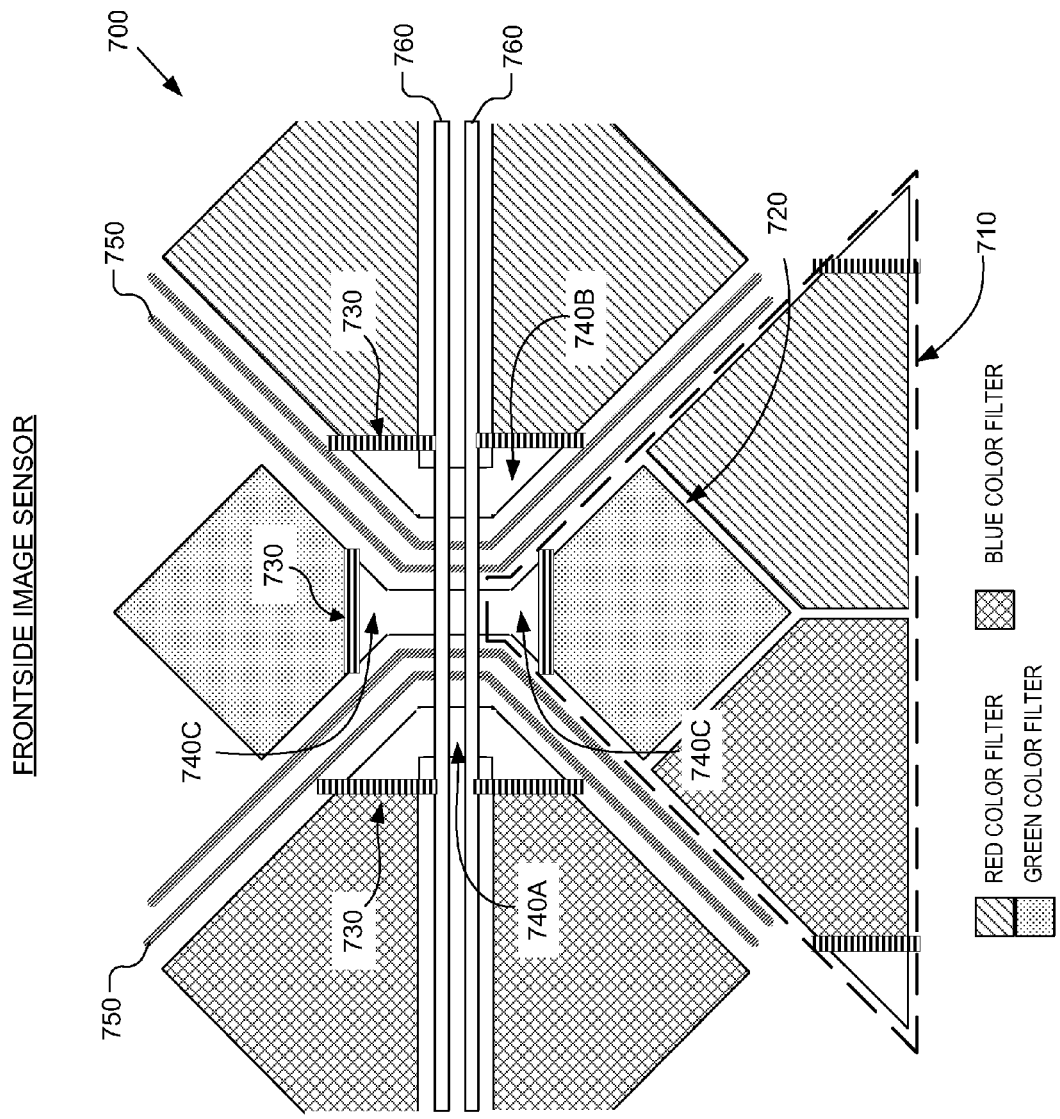
FIG. 7 illustrates a conceptual schematic of the active circuits and metal interconnects for a frontside image sensor, in accordance with an embodiment of the invention.
Figure 8:
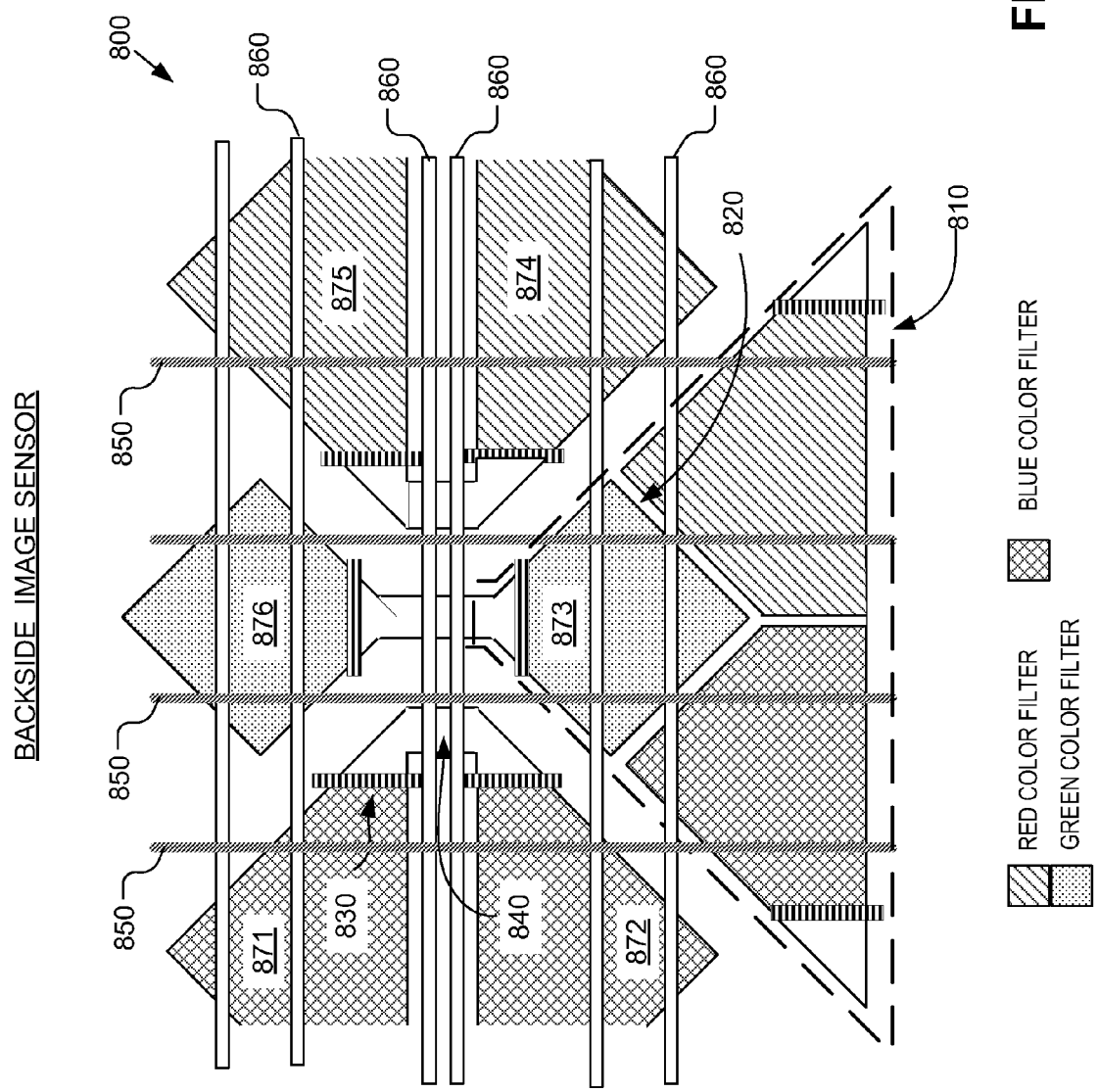
FIG. 8 illustrates a conceptual schematic of the active circuits and metal interconnects for a backside illuminated image sensor, in accordance with an embodiment of the invention.

As mentioned above, with BSI image sensors, incident light has a more direct path through to photosensitive element PD, which may result in a larger photosensitive element when compared to a pixel cell occupying the same area in a FSI image sensor. For simplicity, only the color filter (which is placed between photosensitive element PD and the incident light, and allows incident light of a certain wavelength band through to photosensitive element PD) is illustrated in FIGS. 3-6. FIGS. 7 and 8 illustrate greater details of the placement and orientations of the color filters, transfer transistors, and floating nodes. In FIGS. 3-6, the micropixels of individual macropixels are illustrated without any space separating adjacent micropixels; however, it should be appreciated that insulating material and/or isolating wells may be placed between adjacent micropixels within a given macropixel.

A Bayer patterned macropixel is a repeating unit of a color filter array (CFA) for arranging red, green and blue color filters over an array of photosensitive elements. When a Bayer patterned sensor's charge is read out, the colors are recorded sequentially line by line. One line may be BGBGBG . . . , followed by a line of GRGRGR . . . , and so forth. This is known as sequential RGB.

FIG. 3B illustrates a portion of a color pixel array 350 including triangular macropixels 360 each including three micropixels, in accordance with an embodiment of the invention. The Bayer pattern color pixel array 105 illustrated in FIG. 1 may be substituted or replaced by embodiments of color pixel array 350. Each triangular macropixel 360 is partitioned to obtain three micropixels with an approximate fill ratio of red to green to blue micropixels of 1 to 2 to 1, respectively. Each triangular macropixel 360 includes two triangular micropixels and one quadrilateral (e.g., square, rectangle, rhombus, parallelogram, or even an irregular quadrilateral) micropixel. Duplicate triangular macropixels are arranged on a grid with uniform X and Y separation (e.g., adjacent macropixels are separated by a uniform distance Ip) as measured from common reference points (e.g., reference point 320). The total area of the three micropixels, which form a single triangular macropixel 360, is approximately the same as that of Bayer patterned macropixel 310 in FIG. 3A. In macropixel 360, green color filters are allotted 50% of the total area of the macropixel, while red color filters and green color filters are each allotted 25% of the total area. This is substantially equivalent to the Bayer assignments, but with only one pixel assigned to green color filters. As seen in the patterning of macropixel 360 in color pixel array 350, each red color filter (also referred to as a red micropixel) is adjacent to another red micropixel and adjacent to two green color filters (also referred to as green micropixels). Each blue color filter (also referred to as blue micropixels) is adjacent to another blue micropixel and two green micropixels, while each green micropixel is adjacent to two red micropixels and two blue micropixels.

When referring to "adjacent" micropixels, this is intended to refer to those micropixels that share at least a portion of a parallel common side (even if that common side is in practice separated by a gap for isolation barriers/wells, pixel circuitry, etc), but is not intended to refer to micropixels that merely share a common vertex. Note, the phrase "common vertex" is also used broadly to include the overlapping vertices of two proximate/adjacent micropixels even though in practice their vertices may not actually overlap, but rather are offset due to gaps between adjacent/proximate micropixels. Micropixels that either share a common vertex or at least a portion of a parallel common side without an intervening micropixel are referred to herein as "proximate micropixels."

An advantage of triangular macropixel 360 compared to Bayer patterned macropixel 310 is that since there are only three micropixels in each triangular macropixel 360, that means only three sets of non-photosensitive pixel circuitry elements (e.g., transfer transistor T1, reset transistor T2, etc. as illustrated in FIG. 2) are included within each triangular macropixel 360. In contrast, there are four sets of non-photosensitive pixel circuitry elements in Bayer pattern macropixel 310. As a result, the fill factor of triangular macropixel 360 is greater than the fill factor of Bayer patterned macropixel 310, since less area within each triangular macropixel 360 is devoted to non-photosensitive elements. The greater fill factor facilitates the use of larger photosensitive elements or photodiodes, which may result in an increase in the full well capacity ("FWC") of the photodiode. FWC is the measure of the amount of charge which can be accumulated in a photosensitive element (e.g., PD in FIG. 2) before saturation.

Figures 4A, 4B:
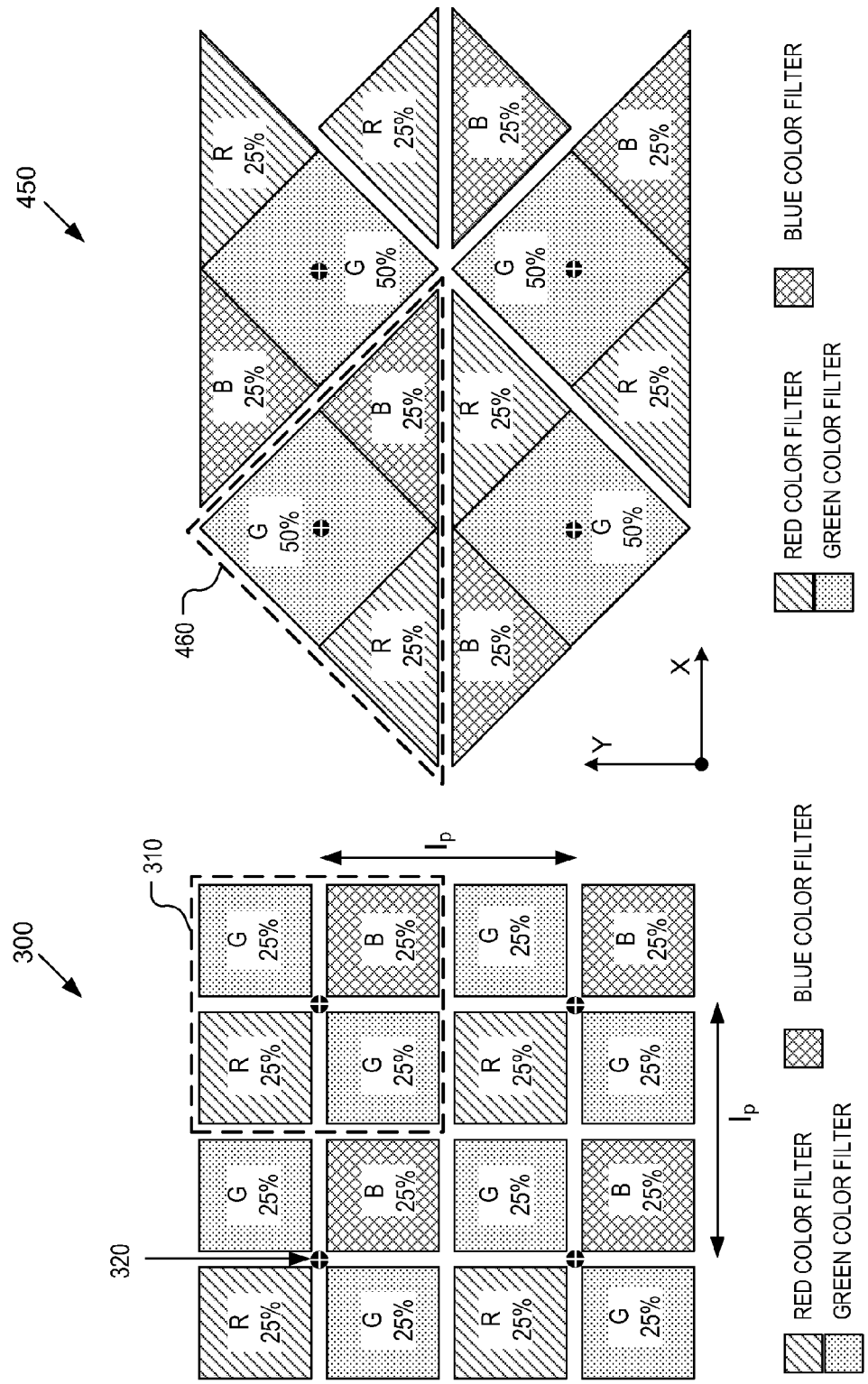
FIG. 4A is a schematic representation of Bayer patterned macropixel blocks.
FIG. 4B is a schematic representation of triangular macropixel blocks each including three micropixels arranged on an X, Y grid, in accordance with a second embodiment of the invention.

FIG. 4A illustrates the same Bayer patterned macropixel 310 for side-by-side comparison against another triangular macropixel 460 illustrated in adjacent FIG. 4B. FIG. 4B illustrates a portion of a color pixel array 450 including triangular macropixels 460 each including three micropixels, in accordance with an embodiment of the invention. The Bayer pattern color pixel array 105 illustrated in FIG. 1 may be substituted or replaced by embodiments of color pixel array 450. Each macropixel 460 is partitioned into three micropixels with an approximate fill ratio of red to green to blue micropixels of 1 to 2 to 1, respectively. Triangular macropixels 460 are similar to triangular macropixels 360, except that the layout of the red and blue micropixels is changed. In color pixel array 450, each red micropixel of a given triangular macropixel 460 is adjacent to a blue micropixel from an adjacent triangular macropixel 460 and two green micropixels (one from within the given triangular macropixel 460 and one from yet another adjacent triangular macropixel 460). Each blue micropixel is adjacent to a red micropixel and two green micropixels, while each green micropixel is adjacent two red micropixels and two blue micropixels.

FIG. 5A illustrates the same Bayer patterned macropixel 310 for side-by-side comparison against another triangular macropixel 560 illustrated in adjacent FIG. 5B. FIG. 5B illustrates a portion of a color pixel array 550 including triangular macropixels 560 each including three micropixels, in accordance with an embodiment of the invention. The Bayer pattern color pixel array 105 illustrated in FIG. 1 may be substituted or replaced by embodiments of color pixel array 550.

Triangular macropixel 560 is partitioned into three micropixels with an approximate fill ratio of red to green to blue micropixels of 1 to 1 to 1, respectively. This 1 to 1 to 1 ratio results in three four-sided polygon micropixels (e.g., one square, rhombus, or rectangular quadrilateral and two irregular shaped quadrilaterals), as opposed to two triangular and one quadrilateral micropixels, as illustrated in the embodiments of FIGS. 3B and 4B. The patterning of triangular macropixel 560 is similar to the patterning for triangular macropixel 360, except that each red polygon micropixel and each blue polygon micropixel is adjacent to five other polygon micropixels and each green polygon micropixel is adjacent to four other polygon micropixels.

FIG. 6A illustrates the same Bayer patterned macropixel 310 for side-by-side comparison against another triangular macropixel 660 illustrated in adjacent FIG. 6B. FIG. 6B illustrates a portion of a color pixel array 650 including triangular macropixels 660 each including three micropixels, in accordance with an embodiment of the invention. The Bayer pattern color pixel array 105 illustrated in FIG. 1 may be substituted or replaced by embodiments of color pixel array 650.

Triangular macropixel 660 is partitioned into three micropixels with an approximate fill ratio of red to green to blue micropixels of 26 to 37 to 37, respectively. This partitioning ratio results in one triangular micropixel (with 26% of the total area of the macropixel) and two four-sided polygon or quadrilateral micropixels (each with 37% of the total area of the macropixel), as illustrated in FIG. 6B. Similar to triangular macropixels 360, each triangular macropixel 660 are arranged on a grid with uniform X and Y separation having uniform pitch Ip as measured from a common reference point within each adjacent macropixel.

Although the triangular macropixels 360, 460, 560, and 660 each have a triangular shape, their layout along with their uniform pitch in the X and Y axis provides rotational symmetry. In other words, whether or not the pixel array is rotated by 90 degrees for a portrait or landscape orientation, vertical and horizontal lines drawn through the middle of the pixel array are lines of symmetry. Furthermore, despite the triangular shape of macropixels 360, 460, 560, and 660, orthogonal X, Y addressing can still be used by control circuitry 120 or readout circuitry 110 to address individual macropixels.

FIG. 7 is a plan view illustrating the active circuit and metal interconnects for an FSI image sensor 700 implemented using triangular macropixels, in accordance with an embodiment of the invention. Each triangular macropixel 710 may be implemented using any of the above described triangular macropixel layouts (e.g., triangular macropixels 360, 460, 560, or 660). Triangular macropixel 710 includes three micropixels separated by shallow trench isolations ("STIs") or isolation wells 720. Transfer gate 730 is located at one corner of each micropixel, with one portion of floating node 740 occupying the apex of each micropixel that is adjacent to transfer gate 730. As illustrated in FIG. 7, each floating node 740 may be shared between two proximate micropixels. For example, floating node (or floating diffusion FD) 740A is shared by two adjacent micropixels on the left from different macropixels, floating node 740B is shared by two adjacent micropixels on the right from different macropixels and floating node 740C is shared by two proximate micropixels in the middle top and middle bottom from two different macropixels.

As previously mentioned, the photosensitive elements of a macropixel in a FSI image sensor are typically not covered by polysilicon or metal interconnects. As such, metal interconnects 750 and 760 are placed around triangular macropixels 710 and their respective color filters so that incident light has a direct path through the color filters to their respective photosensitive elements below. Metal interconnects 750 and 760 may carry control signals (as seen in FIG. 2) such as transfer signal TX, reset signal RST, power rail VDD, address signals or other signals which may be generated by control circuitry 120 or readout circuitry 110 in FIG. 1.

FIG. 8 is a plan view illustrating the active circuit and metal interconnects for a BSI image sensor 800 implemented using triangular macropixels, in accordance with an embodiment of the invention. Each triangular macropixel 810 may be implemented using any of the above described triangular macropixel layouts (e.g., triangular macropixels 360, 460, 560, or 660). Triangular macropixel 810 includes three micropixels, separated by STIs or isolation wells 820. A transfer gate 830 is located at one corner of each micropixel, with one portion of a floating node 840 occupying the apex of each micropixel that is adjacent to transfer gate 830. As illustrated in FIG. 8, floating node 840 may be shared between two proximate micropixels. In the illustrated embodiment, two micropixels share floating node 840; however, in alternative embodiments any number between one and six micropixels may share a single floating node 840. For example, if all six micropixels surrounding a single centralized floating node, then a six-share pixel read out may be implemented. In this six-share pixel read out embodiment, micropixels 871 thru 876 could share one central floating node. In contrast, with Bayer patterned macropixel 310 illustrated in FIG. 3A, at most four micropixels could share a single floating node.

The illumination of a photosensitive element of a BSI image sensor occurs without interference from any frontside metal interconnects or dielectric layers, therefore there are fewer restrictions on the placement of metal interconnects 850 and 860. Metal interconnects 850 and 860 need not routed around the perimeter of macropixels including their color filters. Metal interconnects 850 and 860 may carry control signals (as seen in FIG. 2) such as transfer signal TX, reset signal RST, power rail VDD, address signals or other signals which may be generated by control circuitry 120 or readout circuitry 110 in FIG. 1.

Figure 9B:
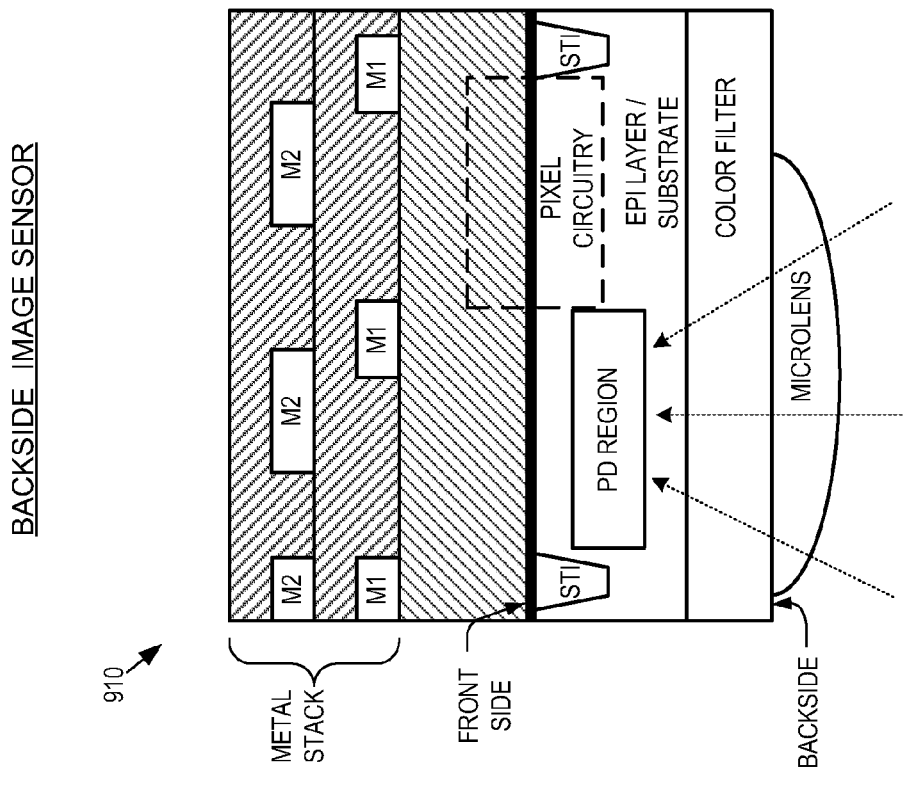
FIG. 9B is a demonstrative simplified cross-sectional view of a backside illuminated imaging pixel, in accordance with an embodiment of the invention.
Figure 9A:
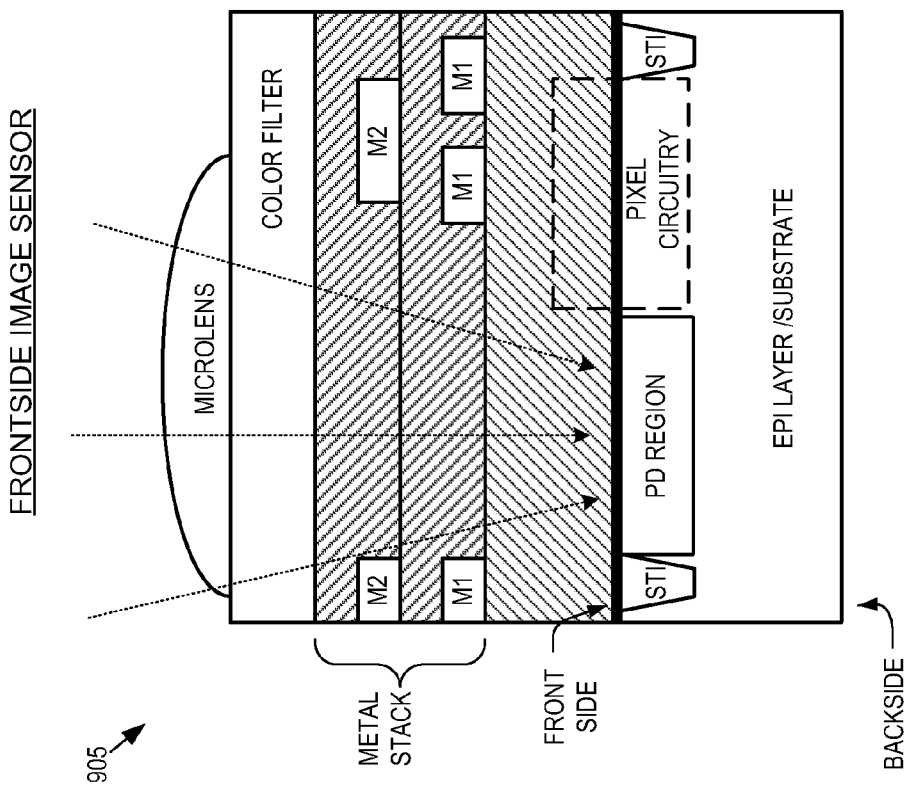
FIG. 9A is a demonstrative simplified cross-sectional view of a frontside illuminated imaging pixel, in accordance with an embodiment of the invention.

FIGS. 9A and 9B are demonstrative simplified cross-sectional views of an FSI imaging pixel 905 and a BSI imaging pixel 910, respectively, in accordance with embodiments of the invention. The color filters in either FSI imaging pixel 905 or BSI imaging pixel 910 may be patterned using any triangular macropixel layouts described above. As illustrated in FIG. 9A, the color filter of FSI imaging pixel 905 is disposed above the metal stack on the frontside of the die, while the color filter of BSI imaging pixel 910 is disposed below the EPI layer/substrate on the backside of the die opposite the metal stack used for routing signals (e.g., metal interconnects 850 and 860 illustrated in FIG. 8).

It should be noted that the above description assumes implementation of image sensors using red, green and blue photosensitive elements. Those skilled in the art having benefit of the instant disclosure will appreciate that the description is also applicable to other primary or complementary color filters. For example, magenta, yellow and cyan are a set of common alternative complementary colors that can be used to produce color images. In addition, having a set of green photosensitive elements interleaved or interspersed with alternating red and blue photosensitive elements is also not necessary, though such configurations are common since the human vision system is more sensitive to colors in the green band than other colors in the visual spectrum.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A color pixel array including a plurality of micropixels, the color pixel array comprising:
    a plurality of photosensitive elements each being included within one of the micropixels; and
    a color filter array including a plurality of color filters each being included within one of the micropixels, the color filters being optically aligned with the photosensitive elements to filter incident light prior to reaching the photosensitive elements,
    wherein the micropixels are organized into a repeating pattern of triangular macropixels each having a triangular shape within the color pixel array,
    wherein each of the triangular macropixels includes more than one of the micropixels,
    wherein a perimeter shape of each of the triangular macropixels forms a triangle.

2. The color pixel array of claim 1, wherein each of the triangular macropixels includes three of the micropixels.

3. The color pixel array of claim 2, wherein the triangular macropixels are orthogonally addressable.

4. The color pixel array of claim 3, wherein the color filter array is rotationally symmetric.

5. The color pixel array of claim 2, wherein the triangular macropixels are patterned into a horizontal and vertical grid with a uniform separation pitch along at least one axis measured from a common reference point within each of the triangular macropixels.

6. The color pixel array of claim 5, wherein each of the triangular macropixels includes a single quadrilateral micropixel and two triangular micropixels.

7. The color pixel array of claim 6, wherein the single quadrilateral micropixel comprises a green micropixel having a green color filter and the triangular micropixels comprise a red micropixel having a red color filter and a blue micropixel having a blue color filter, wherein a fill ratio between the red, green, and blue micropixels is 1 to 2 to 1, respectively.

8. The color pixel array of claim 7, wherein each red micropixel of a given triangular macropixel is adjacent to another red micropixel within another triangular macropixel.

9. The color pixel array of claim 7, wherein each red micropixel of a given triangular macropixel is adjacent to the blue micropixel within another triangular macropixel.

10. The color pixel array of claim 5, wherein each of the triangular macropixels includes a single quadrilateral micropixel and two irregular quadrilateral micropixels.

11. The color pixel array of claim 10, wherein a fill ratio between the single quadrilateral micropixel and the two irregular quadrilateral micropixels is 1 to 1 to 1.

12. The color pixel array of claim 5, wherein each of the triangular macropixels includes a single triangular micropixel and two irregular quadrilateral micropixels.

13. The color pixel array of claim 5, wherein each of the micropixels includes a transfer transistor coupling one of the photosensitive elements to a floating diffusion, wherein each of the micropixels shares the floating diffusion with another micropixel from a different one of the triangular macropixels.

14. The color pixel array of claim 13, wherein each of the micropixels shares the floating diffusion with five other micropixels from five other triangular macropixels.

15. The color pixel array of claim 1, wherein the color pixel array is disposed within a complementary metal-oxide semiconductor frontside illuminated image sensor.

16. The color pixel array of claim 1, wherein the color pixel array is disposed within a complementary metal-oxide semiconductor backside illuminated image sensor.

17. An image sensor, comprising:
a color pixel array including a plurality of micropixels, wherein groups of the micropixels are organized into a non-square repeating pattern of macropixels, wherein each of the macropixels includes three of the micropixels;
control circuitry coupled to the color pixel array to control operation of the color pixel array; and
readout circuitry coupled to the color pixel array to readout color image data from the color pixel array,
wherein the macropixels each have a triangular shape,
wherein a perimeter shape of each of the macropixels forms a triangle.

18. The image sensor of claim 17, wherein the macropixels are patterned to be addressable using orthogonal X, Y coordinates.

19. The image sensor of claim 17, wherein each of the macropixels includes a single quadrilateral micropixel and two triangular micropixels.

20. The image sensor of claim 17, wherein each of the macropixels includes a single quadrilateral micropixel and two irregular quadrilateral micropixels.

21. The image sensor of claim 17, wherein each of the macropixels includes a single triangular micropixel and two irregular quadrilateral micropixels.

22. The color pixel array of claim 17, wherein each of the micropixels includes a transfer transistor coupling a photosensitive element to a floating diffusion, wherein each of the micropixels shares the floating diffusion with another micropixel from a different one of the macropixels.

23. The color pixel array of claim 22, wherein each of the micropixels shares the floating diffusion with five other micropixels from five other macropixels.

24. The color pixel array of claim 1, wherein a shape of each of the micropixels shares at least one vertex with the triangular shape of at least one of the macropixels.

25. The image sensor of claim 17, wherein a shape of each of the micropixels shares at least one vertex with the triangular shape of at least one of the macropixels.

* * * * *